US007890902B1

(12) United States Patent
Sahu et al.

(10) Patent No.: US 7,890,902 B1
(45) Date of Patent: Feb. 15, 2011

(54) METHODS AND APPARATUS FOR MERGING COVERAGE FOR MULTIPLE VERIFICATION AND DESIGN SCENARIOS

(75) Inventors: Bijaya Sahu, Uttar Pradesh (IN); Abhishek Kanungo, Uttar Pradesh (IN); Sandeep Pagey, Uttar Pradesh (IN); Christer Cederberg, St. Paul, MN (US)

(73) Assignee: Cadence Design Systems, Inc., San Jose, CA (US)

( * ) Notice: Subject to any disclaimer, the term of this patent is extended or adjusted under 35 U.S.C. 154(b) by 883 days.

(21) Appl. No.: 11/759,758

(22) Filed: Jun. 7, 2007

(51) Int. Cl.
*G06F 9/45* (2006.01)
*G06F 17/50* (2006.01)

(52) U.S. Cl. .......................................................... 716/5
(58) Field of Classification Search ...................... 716/5
See application file for complete search history.

(56) References Cited

U.S. PATENT DOCUMENTS

| | | | | |
|---|---|---|---|---|
| 5,778,167 | A * | 7/1998 | Carrel et al. .................... | 714/8 |
| 6,223,272 | B1 * | 4/2001 | Coehlo et al. ................... | 712/1 |
| 6,718,521 | B1 * | 4/2004 | Bentlage et al. ................ | 716/4 |
| 7,178,112 | B1 * | 2/2007 | Ciolfi et al. ..................... | 716/1 |
| 7,181,708 | B1 * | 2/2007 | Du et al. ......................... | 716/5 |
| 7,243,337 | B1 * | 7/2007 | Cowan .......................... | 717/127 |
| 7,587,690 | B1 * | 9/2009 | Siarkowski et al. ............. | 716/4 |
| 2003/0121011 | A1 * | 6/2003 | Carter ............................ | 716/4 |
| 2005/0102596 | A1 * | 5/2005 | Hekmatpour ................... | 714/741 |
| 2005/0283664 | A1 * | 12/2005 | Coulter et al. ................. | 714/15 |
| 2007/0089007 | A1 * | 4/2007 | Wood et al. .................... | 714/738 |
| 2008/0022262 | A1 * | 1/2008 | Prakash et al. ................. | 717/124 |

OTHER PUBLICATIONS

Kim et al.; "Program Element Matching for Multi-Version Program Analyses"; May 23, 2006; Computer Science & Engineering University of Washington; ACM; pp. 58-64.*

* cited by examiner

*Primary Examiner*—Jack Chiang
*Assistant Examiner*—Suresh Memula
(74) *Attorney, Agent, or Firm*—Kilpatrick Townsend & Stockton LLP (57) ABSTRACT

A method and apparatus for producing a verification of digital circuits are provided. In an exemplary embodiment, design and verification checksums are calculated for instances of a desired module. The design and verification checksums may be used to further derive hierarchical design and functional checksums. In another embodiment, these checksums are used to merge multiple databases produced by verification runs. In a further embodiment a computing apparatus is provided. The computing apparatus is configured to merge multiple verification databases.

24 Claims, 9 Drawing Sheets

PRIOR ART

METHODS AND APPARATUS FOR MERGING COVERAGE FOR MULTIPLE VERIFICATION AND DESIGN SCENARIOS

FIELD OF THE INVENTION

The present invention generally relates to integrated circuits. More particularly, the invention concerns methods and apparatus for merging coverage in integrated circuit design.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs must be highly functional, low cost and have low power consumption. These demands create increased complexity on the design, verification, and manufacture of ICs.

A typical IC design may involve the creation of electronic components, such as transistors and resistors, and the interconnections of these components onto a substrate, such as silicon. The simulation, verification, and sometimes layout of these components usually is accomplished in sub-blocks, or modules. Each block may be simulated and verified individually. Multiple design teams typically work on the individual blocks. During the design process functional verification is critical.

Functional verification involves the verification that the design conforms to the specification. Functional verification may involve the validation that a design meets the desired functionality. Part of the process of verification includes the creation of Register Transfer Level (RTL) digital designs that describe in detail the functionality of the device or block at every cycle of the clock. Creation and verification of RTL designs may be one of the more difficult portions of the design process. In many instances, this verification is a very difficult and time intensive task. Simulation tools are typically used to assist in verification. In most designs, simulation-based functional verification is performed on multiple machines in parallel. During the verification process "coverage" data is produced that indicates which portions of the functionality and/or code have been tested.

Figure 1:
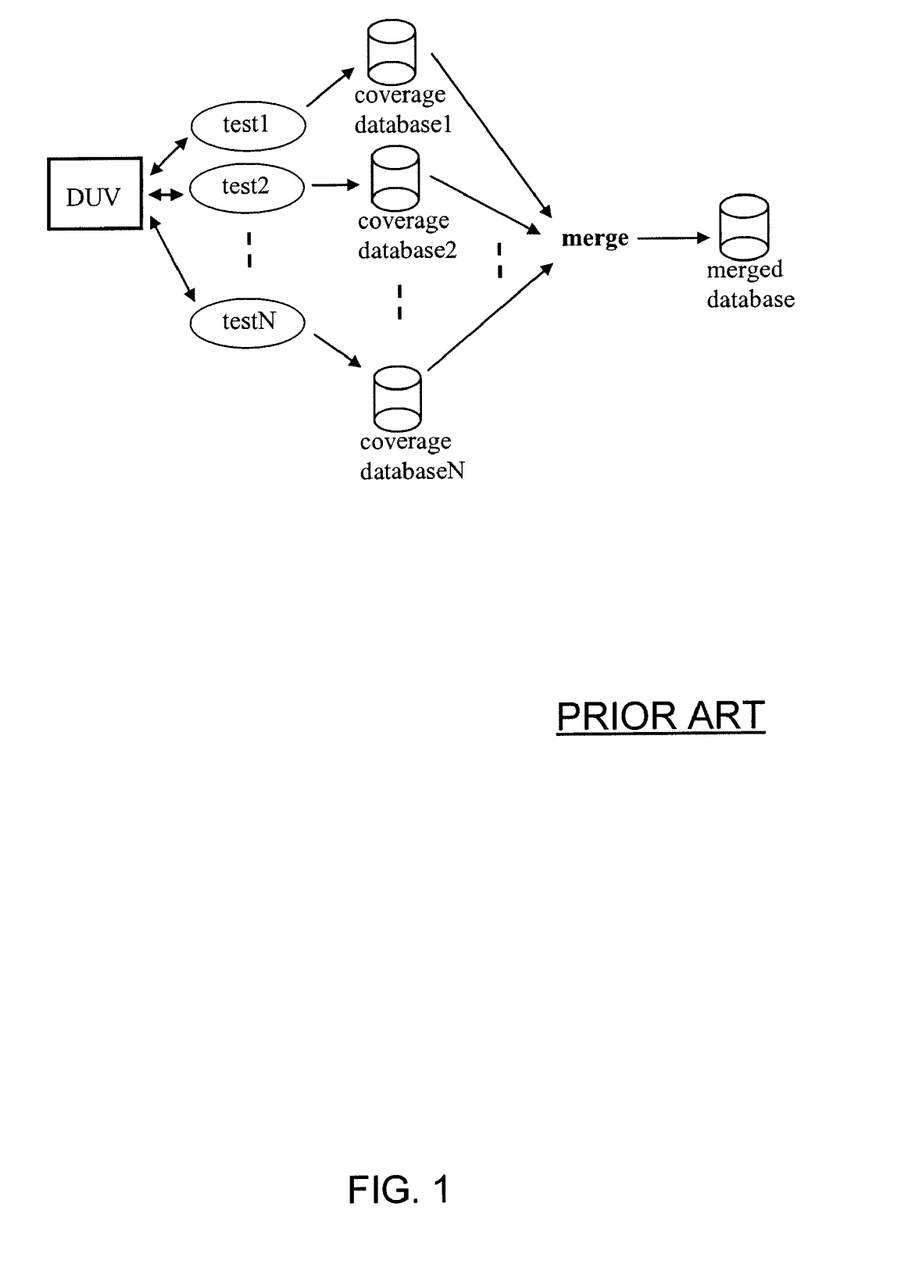
FIG. 1 Illustrates a simple coverage merger flow in the prior art.

Until recently, using coverage in the verification cycle of digital designs was done using a very simple flow and was restricted mainly to using code coverage. In the simplest flow, described in FIG. 1, a design under verification (DUV) is stimulated using multiple testbenches and a coverage database is generated for the DUV for each simulation run. Once all the simulations have been run, the coverage databases obtained from each run are merged together to get a comprehensive view of the coverage obtained from the entire verification.

If the design under verification (DUV) is identical across all the simulation runs, the merge is straightforward since the design hierarchy and the set of coverage points are identical. In practical usage, this is not the case. Multiple design teams work on blocks of a chip. In order to get a complete view, the coverage results from simulations of the individual blocks need to be stitched together to get the chip-level view. Different configurations of a chip may be run in different simulations. As part of user methodology, different simulation runs of the same design have different modules at different levels of abstraction. For example, one level of abstraction may contain modules written in a higher level language, such as systemC, while another may be written in a low level language such as a Hardware Description Language (HDL). As multiple teams work on various parts of a design and the design evolves over time, both the design hierarchy (affecting code coverage) and the functional coverage points (affecting functional coverage) undergo changes.

Therefore there exists a need for a system, and methods for improved merging of coverage databases.

SUMMARY OF THE INVENTION

The present invention provides a system, apparatus and methods for overcoming some of the difficulties presented above. In an exemplary embodiment, a method of producing a verification of a digital design is provided. The method involves deriving design checksums from a first plurality of coverage points in a first portion of a digital design. Verification checksums can be derived from coverage points from the design. These hierarchical checksums may then be derived from the design and verification checksums. In one embodiment, the verification checksums are derived for individual functional coverage points, these are derived for each instance. The hierarchical checksums are derived for all child instances in a hierarchy. A verification run may then be performed on the digital design producing a verification result. This verification result may be a coverage database that includes the coverage data and checksums described above.

In another embodiment, a method is provided for merging databases from multiple verification runs to provide a verification result. In this embodiment first and second coverage databases are utilized. The coverage databases may include verification data on a plurality of modules of a digital design. In this embodiment, at least one module has an instance in both coverage databases and the verification data may include a total design checksum and a verification checksum. In this method the total design checksum for a first, or top, instance of a module in the first database is compared to the total design checksum for an instance of the module in the second database. The checksums for an instance of the module in the first and second coverage databases are compared to each other, and based on these comparisons the coverage databases are merged.

In a still further embodiment, a computing apparatus is provided. The computing apparatus is configured to merge coverage databases. These databases may include design checksums derived from a first plurality of coverage points in a first portion of a digital design. They may also include verification checksums that are derived from coverage points from the design. Further, the coverage databases may include hierarchical checksums that are derived from the design and verification checksums. The merge configuration may include comparing a total design checksum for an instance of a module present in multiple coverage databases. The configuration may additionally compare verification checksums for instances of a module present in multiple databases. Depending on the outcome of these comparisons, the coverage databases may be merged.

One feature of this embodiment is that it allows for multiple verification runs to be merged. These verification runs may include whole design verifications or may be directed towards modules of a design. Additionally, functional coverage and code coverage may be merged using the apparatus and methods provided herein.

BRIEF DESCRIPTION OF THE DRAWINGS

Various embodiments of the present invention taught herein are illustrated by way of example, and not by way of limitation, in the figures of the accompanying drawings, in which.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention.

Descriptions of well known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Verification is the process of validating whether a circuit design conforms to the specification it was designed to meet. In smaller designs the task of verification may be trivial, but as digital design complexity increases verification becomes significantly difficult. In most digital designs suited for commercial applications, there may be no possibility of exercising all logic. Simulation based verification is widely used to simulate the design. Stimulus is provided in the form of a testbench that seeks to verify the design by providing scenarios that attempt to ascertain that a design responds to a given input by producing an appropriate output.

Simulation-based functional verification of Register Transfer Level (RTL) digital designs typically uses code coverage and functional coverage to determine the completeness of verification. These methods can be very processor intensive and may typically be performed on multiple machines in parallel. Coverage data is generated by each machine and stored in a coverage database. Once the simulations are complete, the coverage data may be merged to get a complete view of the verification coverage achieved by each of the verification runs. These approaches experience significant difficulties as the design matures. Some blocks, or modules, of a chip design may change over the design life cycle. Additionally, some modules may be changed and it would be advantageous to verify the new changes to a module and directly merge the results with a chip-level verification.

Figure 2:
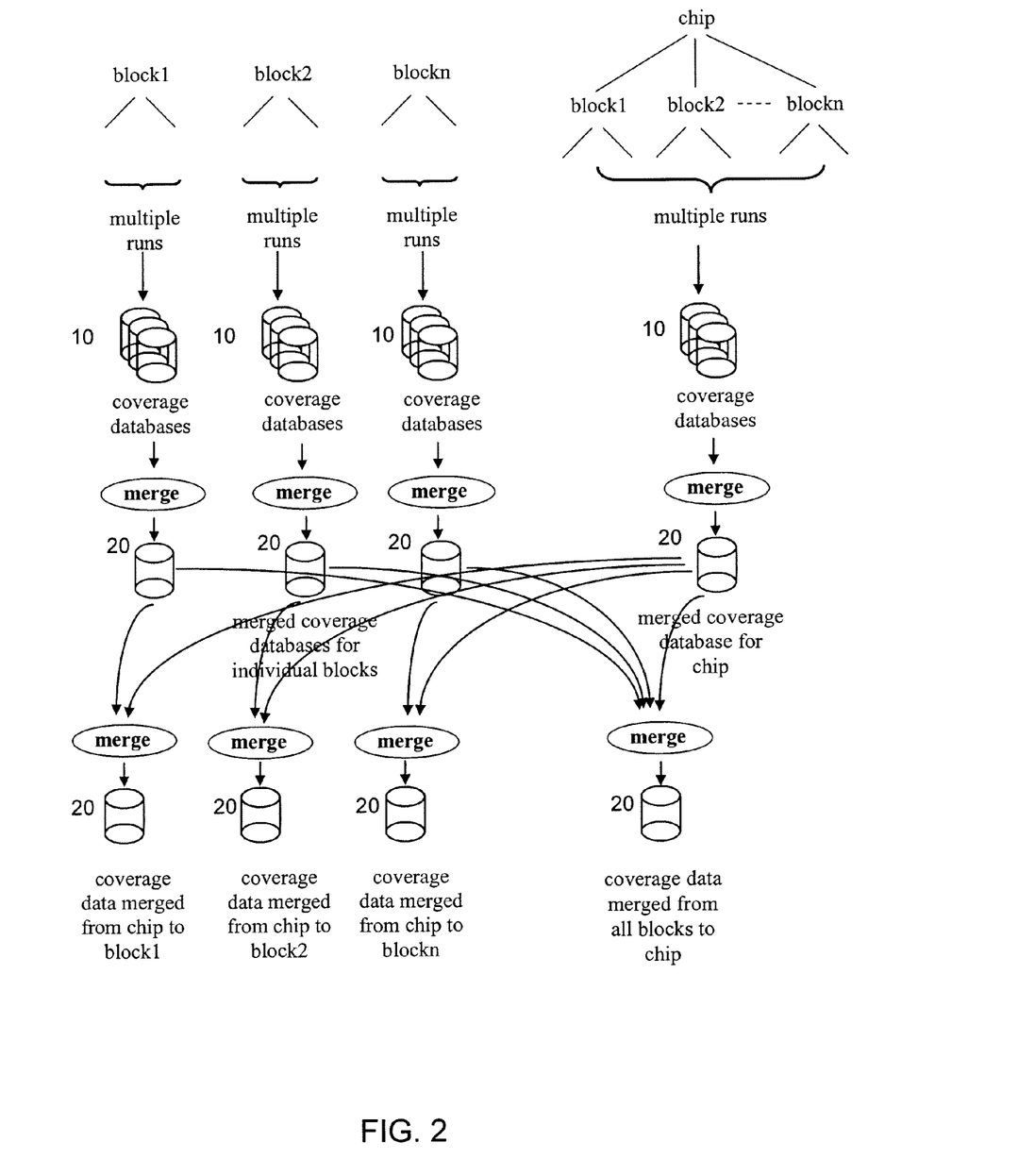
FIG. 2 illustrates chip level and block level coverage merges consistent with various provided embodiments.

In most digital designs, the major blocks of a chip may be designed by independent design teams and multiple simulation verification runs may be performed on each block. The databases of individual blocks and chip can be merged independently to get the coverage figures for all the runs performed on a particular block or a chip. In order to get a complete picture, it should be possible to merge the coverage information of all the blocks into the chip's coverage information. Alternately, it should also be possible to merge the coverage information of a block obtained from its block-level run with the coverage information of a block from the chip-level run One feature of the present invention is illustrated in FIG. 2. By employing the methods presented herein, blocks of a chip, blocks 1-$n$, may be verified in multiple runs producing multiple coverage databases 10. These multiple coverage databases 10 may be merged into a single merged coverage database 20 for each block. Additionally, multiple verification runs may be performed on the entire chip producing multiple coverage databases 10. These coverage databases 10 may be merged into a single merged coverage database 20 for the entire chip. Since the chip may comprise the same blocks 1-$n$, components of the merged coverage database 20 for the entire chip may be merged with merged coverage databases 20 for individual blocks of the chip. In like manner, the merged coverage databases 20 for the individual blocks may be merged with the merged coverage database 20 for the entire chip.

Figure 3:
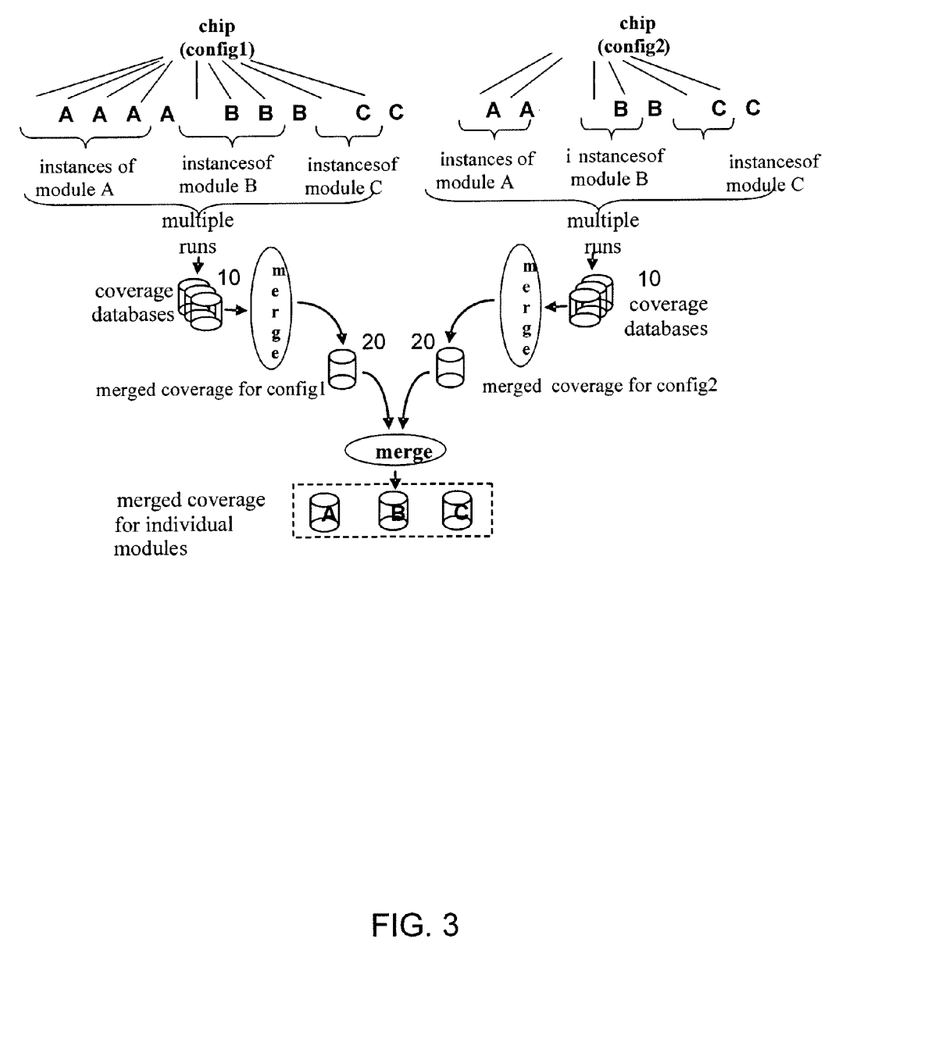
FIG. 3 illustrates the merger of coverage databases from different configurations of a chip.

During the design cycle different configurations of a chip may be designed. Many of the blocks of the chip may be common between the different configurations. In one embodiment, illustrated in FIG. 3, coverage databases 10 are generated from multiple runs of a first chip configuration config1. Additionally, coverage databases 10 are generated from multiple runs of a second chip configuration config2. Chip configurations config1 and config2 may comprise multiple instances of modules A, B, and C. As illustrated, config1 and config2 may share significant commonality in modules A, B, and C. Coverage databases 10 are then merged to produce merged coverage databases 20. Since there is significant commonality in structure of config1 and config2, merged coverage databases may be further merged to produce merged coverage for individual modules of blocks A, B, and C.

Figure 4:
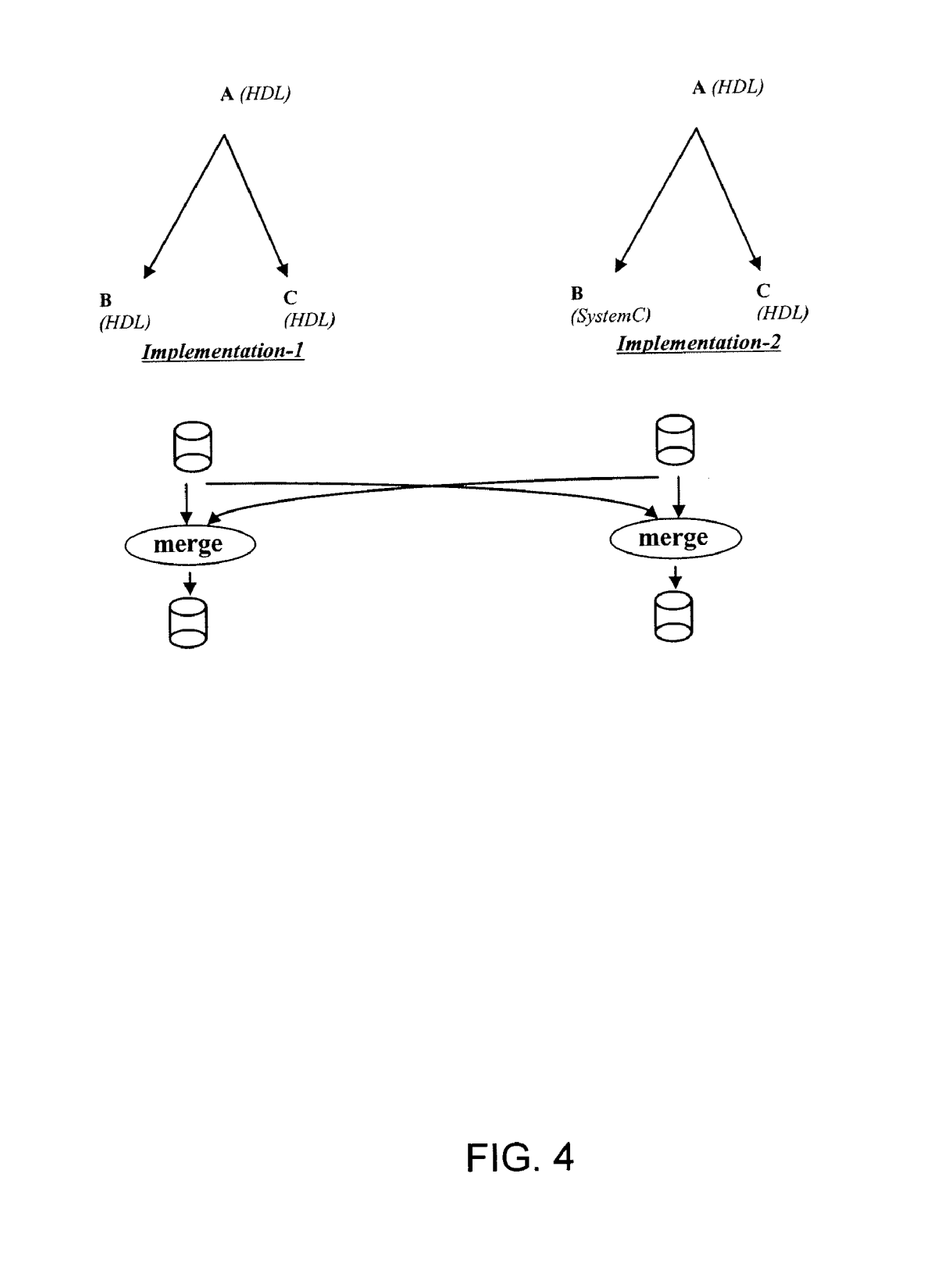
FIG. 4 illustrates code coverage merger for designs at different levels of abstraction.

A design may evolve over project duration where the abstraction level of major blocks changes from a higher level (for instance implementation in SystemC) to lower level (for instance implementation in a Hardware Description Language "HDL"). For example as illustrated in FIG. 4, multiple implementations of the same design may have different combinations of HDL and SystemC components. FIG. 4 depicts one embodiment where Implementation-2 contains block, or module, B described in SystemC whereas the same module B is described in HDL in Implementation-1. Code coverage merge can be done from Implementation-2 to Implementation-1 and vice-versa in which all HDL components are merged ignoring the SystemC components.

One feature of these embodiments is they allow for the merger of coverage data generated at different stages of implementation. As the design changes and matures, some previously verified modules may be deselected in subsequent verification runs. Additionally, as errors are corrected in various modules, the system and methods provided herein allow for verification coverage from prior runs to be merged with new verification runs, thereby reducing the time necessary to verify the modified design.

Figure 5:
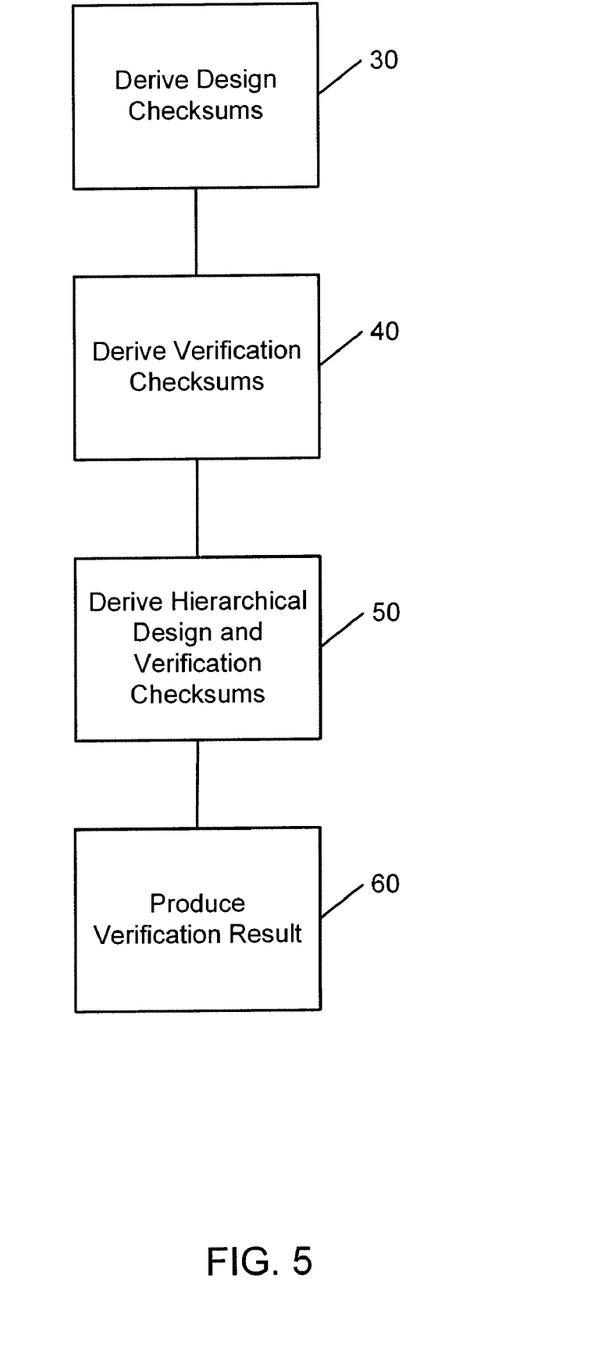
FIG. 5 is a flow chart illustration of a provided method.

One embodiment of the operational flow of a verification apparatus is illustrated in FIG. 5. In this embodiment, the verification apparatus begins operation in block 30 where it derives design checksums for various coverage points in a digital design. The process of deriving a design checksum, in one embodiment includes associating a unique number to each HDL construct in the coverage point. For example, a unique number can be associated to control statements like IF, ELSE, ELSIF, FOR, and WAIT. Unique numbers can also be associated with other HDL constructs like expression operators, declarations etc. For a module, or other coverage point in the design a checksum may then be calculated from the unique numbers. As is known in the art, a checksum is an algorithm based method of determining the integrity of a digital data object. One exemplary algorithm for generating a checksum is known a cyclical redundancy check (CRC). Since the CRC algorithm is widely known in the art, the details of CRC are not provided here.

Flow continues to block 40 where verification checksums are derived. Verification checksums differ from design checksums in that verification checksums relate to functional coverage where design checksums relate to code coverage. In block 40, like the above, a unique checksum is derived for functional coverage points within the instance of the module. Flow then continues to block 50 where hierarchical design and verification checksums are derived from the previously derived design and verification checksums of an instance and its children instances. These new checksums are calculated for all objects in the instance in an hierarchical manner.

Flow continues to block 60, where a verification result is produced from a verification run. As discussed above, the verification result may comprise a coverage database 10 that includes the checksums and coverage information for the instance of the module being verified.

One feature of this embodiment is that it provides a method of determining when changes have occurred within a module of a digital design. Since the checksums are derived from unique numbers assigned to the structures in the module, subsequent changes to the module will result in a different checksum value being assigned. Checksums may then be compared across a number of verification runs and if an instance of a module in the design has the same checksum, the verification results may be merged across these runs.

Figure 6:
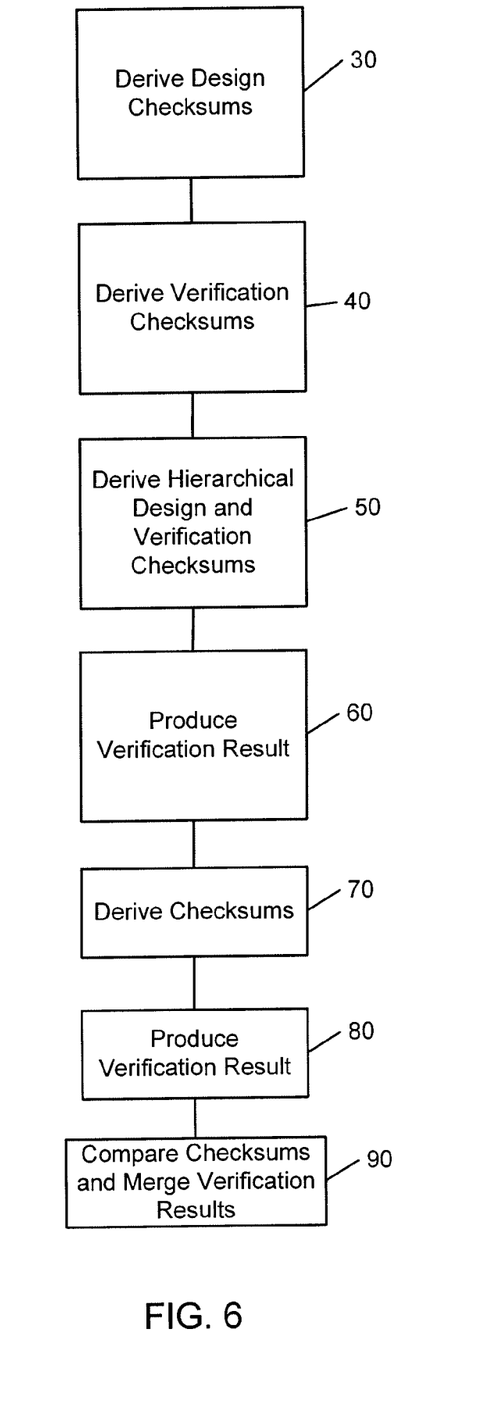
FIG. 6 is a flow chart illustration of a provided method.

Another embodiment of the operational flow of a verification apparatus is illustrated in FIG. 6. In this embodiment, the flow is the same as FIG. 5 for blocks 30-60. In block 70 a second verification run derives design, verification, and hierarchical checksums for the digital design. Flow continues to block 80, where a second verification result is produced. As described above, the verification result may comprise a coverage database 10. Flow then continues to block 90 where the checksums from the first verification result are compared to the checksums for the second verification result. When matching checksums are found, in the first and second verification results, the results are merged for those instances where checksums match. As discussed above this merged result may be stored in a merged coverage database 20.

Figure 7:
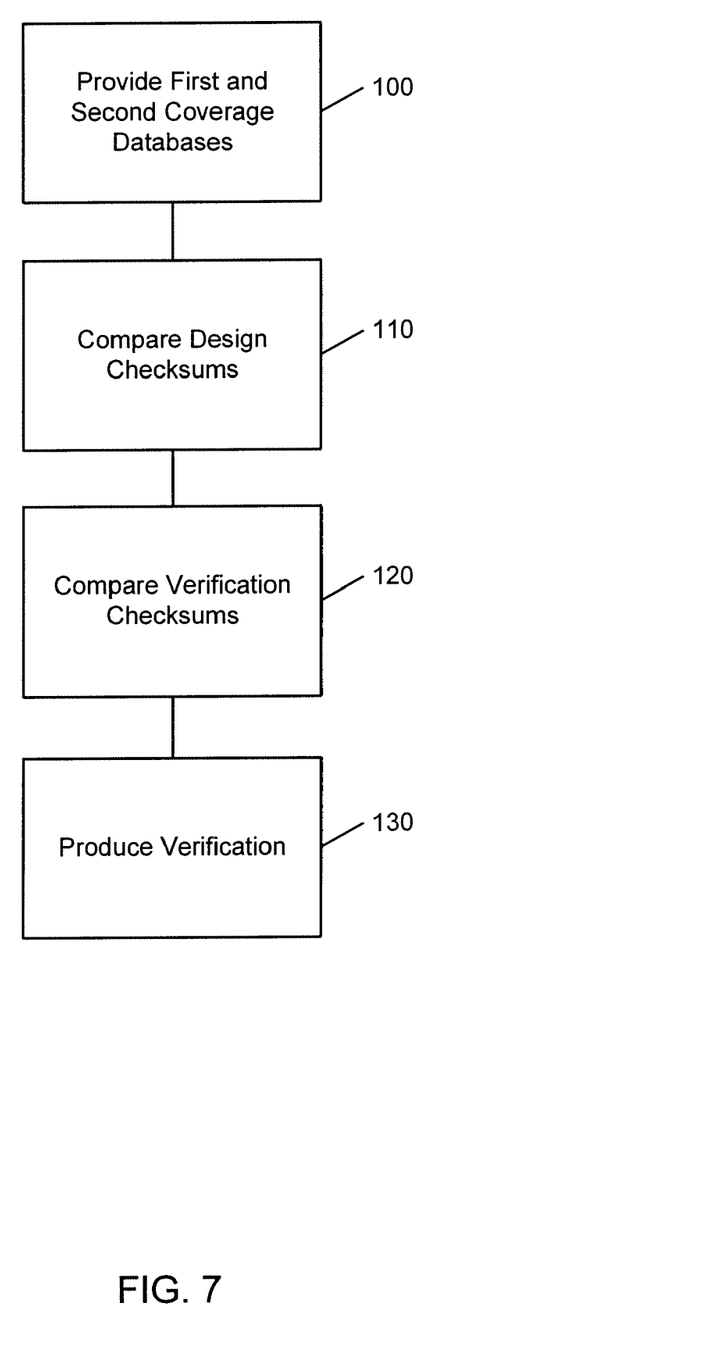
FIG. 7 is a flow chart illustration of a provided method.

FIG. 7 illustrates another embodiment of the flow of a verification apparatus provided herein. The flow begins in block 100 where a first and a second coverage database 10 (FIG. 3) are provided. Flow continues to block 110 where design checksums for instances of like modules from each of the first and second coverage databases 10 are compared. Flow continues to block 120 where verification checksums for instances of like modules from each of the coverage databases 10 are compared. As discussed above, the comparison of design and verification checksums may include a comparison of hierarchical design and verification checksums representing a plurality of design and verification checksums. In block 130 a verification result is produced. This verification result may include merged results from the first and second coverage databases 10 in the form of a merged coverage database 20. It is important to note that a plurality of coverage databases 10 may be used to practice the current invention, the exemplary embodiment depicted in FIG. 7 shows first and second coverage databases for convenience.

Figure 8:
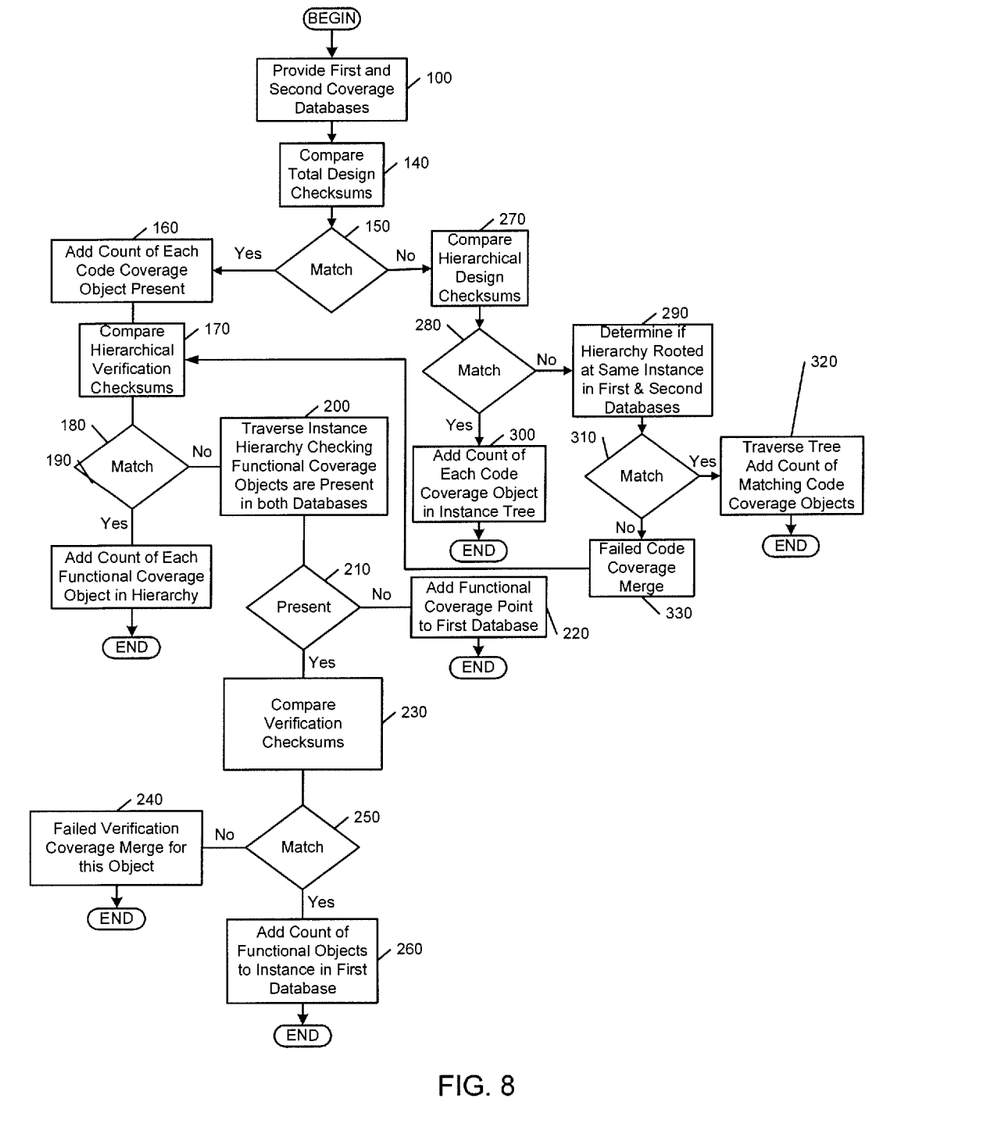
FIG. 8 is a flow chart illustration of a provided method.

FIG. 8 illustrates the flow of a verification apparatus consistent with one embodiment provided herein. Here, like in the previous embodiment, flow begins in block 100 where a first and a second coverage database 10 are provided. Flow continues to block 140 where total design checksums for instances of like modules from each of the first and second coverage databases 10 are compared. If in block 150 it is determined that the total design checksums match, flow continues to block 160 where the count of corresponding code coverage objects in the second coverage data base 10 is added to corresponding code coverage objects in the first coverage database 10. Flow then continues to block 170 where a comparison of hierarchical verification checksums is performed. If, in block 180 it is determined that the hierarchical verification checksums match, flow continues to block 190 where the count of corresponding functional coverage objects in the second coverage data base 10 is added to corresponding functional coverage objects in the first coverage database 10.

Returning to block 180, if the hierarchical verification checksums do not match, flow continues to block 200, where it is determined if the functional coverage objects in the hierarchy are present in both databases. This determination may be made by traversing the instance hierarchy checking for the presence of like objects in the first and second coverage databases 10. For each object in the hierarchy, if it is determined that the object is present in both coverage databases 10, in block 210, the verification checksums for these objects are compared in block 230. If it is determined, in block 250, that the verification checksums do not match, flow proceeds to block 240 where a failure to merge functional verification objects is reported. On the other hand, if a match is found in block 250, flow proceeds to block 260 where the count of each functional coverage objects in the first database is increased by the objects with matching verification checksums. Returning to decision block 210, if it is determined that a functional coverage point present in the second coverage database 10 is not present in the first coverage database 10, flow continues to block 220 where the additional functional coverage point is added to the ones present in the first coverage database.

Returning to decision block 150, if the comparison of design checksums does not match, flow continues to block 270 where hierarchical design checksums are compared. If it is determined in decision block 280 that the hierarchical design checksums match, flow is continued to block 300, where the count of each code coverage object in the instance tree of the hierarchy from the second coverage database 10 is added to those in the matching instance tree of the first coverage database 10. If no match is found in decision block 280, flow proceeds to block 290 where it is determined if the hierarchy is rooted at the same instance and is isomorphic in the first and second coverage databases 10. If in block 310 the instance hierarchy is found to be isomorphic, flow continues to block 320 where the instance tree is traversed. During the traversal of the instance tree comparison of design checksums for matching instances in the tree are conducted and where matches are found, the count of matching code coverage objects of those instances is added to the first coverage database 10. If in decision block 310 it is determined that the hierarchies are not isomorphic, flow proceeds to block 330 where a code coverage failure may be reported for that hierarchy. Flow then proceeds to block 170 for a check of functional coverage as described above.

Digital design verification can be significant in terms of calculation complexity, time to complete, and the memory requirements of a computer running the verification. In one embodiment, illustrated in FIG. 9, a computing apparatus 390 is provided. In this embodiment, computing apparatus 390 may be configured using a software product that implements the methods described above. Computing apparatus 390 may comprise an input device 340, a processor 350, a storage media 370, an output device 380 and memory 360. As is known in the art, various other components are necessary for computing apparatus 390 to be fully operational. These other components are not illustrated for purposes of convenience. Input device 340 may comprise a device for computer program product input, like a floppy drive, a CD-Rom drive, a DVD-drive, an optical drive to name a few. Many input devices 340 are known in the art and may be used to practice the present invention. In that regard, embodiments provided herein are not limited with respect to a particular input device 340. In like manner, various processors 350, storage media 370, output devices 380, and memory 360 are known in the art and may be used to practice the embodiments provided herein.

Figure 9:
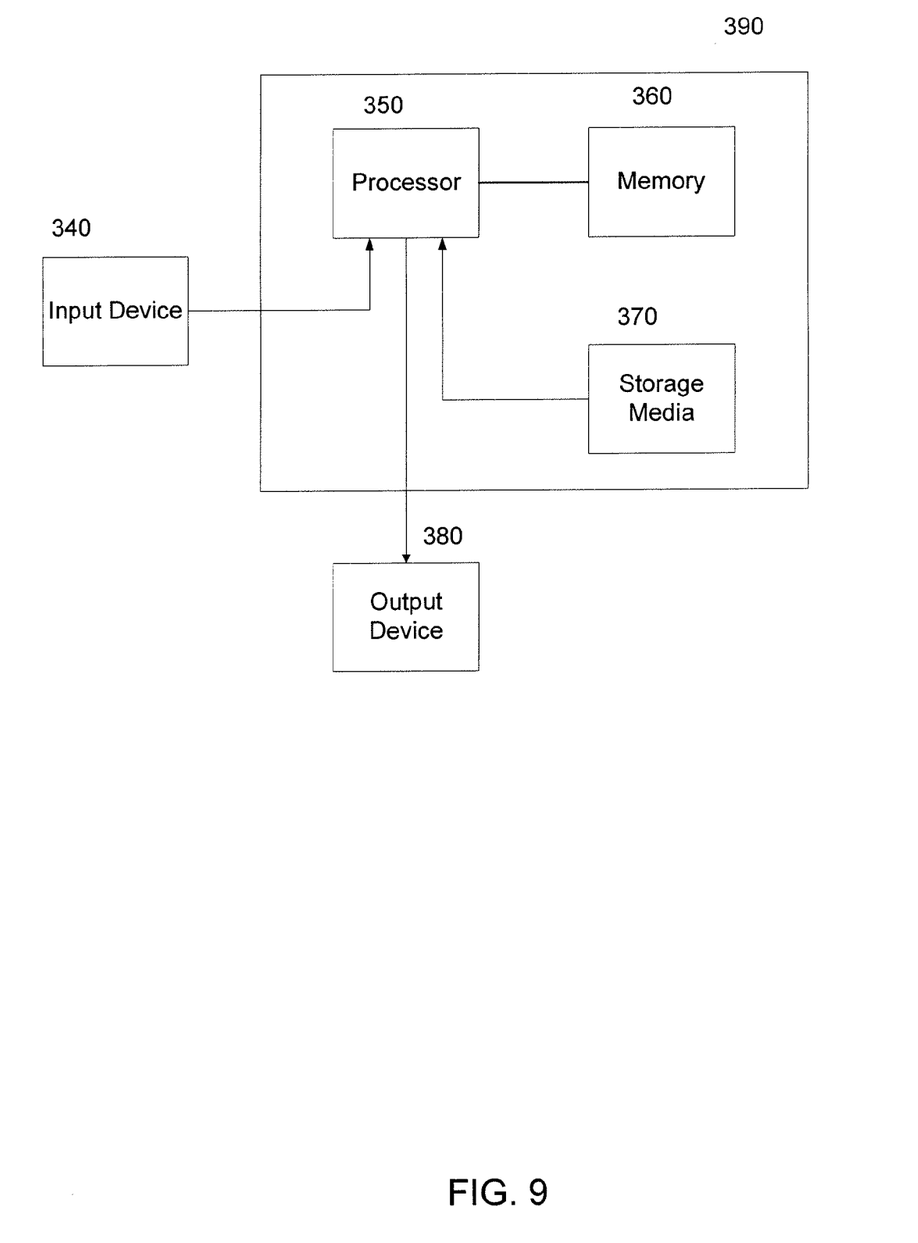
FIG. 9 illustrates a computing apparatus consistent with provided embodiments.

As stated above, computing apparatus 390 may be configured by a computer software product that may take the form of a media containing program instructions that configure computing apparatus 390 to perform a digital design verification. In one embodiment, the media may be external to computing apparatus 390 and intended to interface with computing apparatus 390 through input device 340. In another embodiment, the media containing the instructions may be a hard drive on a network where computing apparatus 390 is connected through a network connection (not shown). As is known in the art, a network may comprise a local area network within a company or may be a significantly larger network such as the Internet.

One feature of a computing apparatus 390 configured with the computer software product provided herein is that it may efficiently verify digital designs of sizes where other software configurations may fail due to memory limitations.

Thus, it is seen that a system, method and apparatus for merging verification coverage and producing verifications are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A method of producing a verification of a digital design using a computing apparatus comprising:
    deriving, using the computing apparatus, a plurality of first design checksums from a first plurality of coverage points in a first portion of a digital design;
    deriving, using the computing apparatus, a plurality of first verification checksums from a second plurality of coverage points in a second portion of a digital design;
    deriving, using the computing apparatus, second design and verification checksums, the second design and verification checksums being derived from the first derived pluralities and comprising a hierarchical representation of the plurality of first design and verification checksums; and
    producing, using the computing apparatus, a verification result by performing a verification run on the digital design.

2. The method of claim 1, wherein the first plurality of coverage points comprises coverage points selected from a group consisting of a plurality of code coverage points and a plurality of functional coverage points.

3. The method of claim 1, wherein the first portion of a digital design comprises substantially all of the digital design.

4. The method of claim 1, wherein the second portion of a digital design comprises substantially all of the digital design.

5. The method of claim 1, wherein the first and the second portion of the digital design substantially overlap.

6. The method of claim 1, further comprising
    deriving a plurality of third checksums from a third plurality of coverage points; and
    producing a second verification result by performing a second verification run on the digital design.

7. The method of claim 6, wherein the third plurality of coverage points comprises coverage points selected from a group consisting of a plurality of code coverage points and a plurality of functional coverage points.

8. The method of claim 6, further comprising
    comparing at least one of the third plurality of checksums with a previously computed checksum and merging the first and second verification results when the 5 compared checksums are equal.

9. The method of claim 6, further comprising
    comparing at least one of the third plurality of checksums with a previously computed checksum and traversing the hierarchical representation performing additional checksum comparisons.

10. The method of claim 1, wherein the method is executed by a processor configured by a set of computer executable instructions.

11. A method of producing a verification of a digital design using a computing apparatus, the method comprising:
    providing first and second coverage databases in a storage medium of the computer apparatus, the coverage databases comprising verification data on a plurality of modules of a digital design, at least one module having an instance in each coverage database, the verification data comprising a total design checksum and a verification checksum;
    comparing, using the computing apparatus, the total design checksum for a first instance of a module in the first database to the total design checksum for a second instance of the module in the second database;

comparing, using the computing apparatus, the verification checksum for the first instance of a module to the second instance; and producing, using the computing apparatus, a verification of a digital design from the results of the comparisons.

12. The method of claim 11, wherein each module is associated with a code coverage object, the method further comprising adding a count of each code coverage object in the second coverage database to a count of code coverage objects in the first database.

13. The method of claim 11, wherein each module is associated with a code coverage object and the verification data further comprises a hierarchical design checksum, the hierarchical design checksum computed from an instance tree, the method further comprising adding a count of each code coverage in the instance tree in the second coverage database to a count of code coverage objects in the instance tree of the first coverage database.

14. The method of claim 11, wherein each module is associated with a functional coverage object, the method further comprising adding a count of each functional coverage object in the second database to a count of functional coverage objects in the first database.

15. The method of claim 11, wherein each module is associated with a functional coverage object, the method further comprising adding a functional coverage object to the first database from the second database.

16. The method of claim 11, wherein each module is associated with a code coverage object and the verification data further comprises a hierarchical design checksum, the hierarchical design checksum computed from an instance tree, the method further comprising
traversing the instance tree in the first and second coverage databases;
comparing checksums for code coverage objects in the instance trees; and
adding a count of code coverage in the instance tree in the second coverage database to a count of code coverage objects in the instance tree of the first coverage database.

17. An apparatus for verification of a digital design description comprising:
a non-transitory storage media coupled to a processor, the processor configured to verify a digital design description by a configuration to:
derive a plurality of first design checksums from a first plurality of coverage points in a first portion of a digital design;
derive a plurality of first verification checksums from a second plurality of coverage points in a second portion of a digital design;
derive second design and verification checksums, the second design and verification checksums being derived from the first derived pluralities and comprising a hierarchical representation of the plurality of first design and verification checksums; and
produce a verification result by performing a verification run on the digital design.

18. The apparatus of claim 17, wherein the first plurality of coverage points comprises a plurality of code coverage points and the second plurality of coverage points comprises a plurality of functional coverage points.

19. The apparatus of claim 17, wherein the first portion and second portions of the digital design substantially overlap.

20. The apparatus of claim 17, wherein the configuration further comprises a configuration to
derive a plurality of third checksums from a plurality of coverage points; and
produce a second verification result by performing a second verification run on the digital design.

21. The apparatus of claim 20, wherein the third plurality of coverage points comprises coverage points selected from a group consisting of code coverage points and functional coverage points.

22. The apparatus of claim 20, wherein the first and second verification results are first and second coverage databases, the coverage databases comprising verification data on a plurality of modules of a digital design at least one module having an instance in each coverage database, the verification data comprising a total design checksum and a verification checksum;
the configuration further comprising a configuration to
compare the total design checksum for a first instance of a module in the first database to the total design checksum for a second instance of the module in the second database;
compare the verification checksum for the first instance of a module to the second instance.

23. The apparatus of claim 22, wherein each module is associated with a functional coverage object, the configuration further comprising a configuration to add a functional coverage object to the first database from the second database.

24. The apparatus of claim 22, wherein each module is associated with a code coverage object and the verification data further comprises a hierarchical design checksum, the hierarchical design checksum computed from an instance tree, the configuration further comprising a configuration to
traverse the instance tree in the first and second coverage databases;
compare checksums for code coverage objects in the instance trees; and
add a count of code coverage in the instance tree in the second coverage database to a count of code coverage objects in the instance tree of the first coverage database.

* * * * *